(12) United States Patent
Jo

(10) Patent No.: US 9,843,009 B2
(45) Date of Patent: Dec. 12, 2017

(54) ORGANIC LIGHT EMITTING ELEMENT AND ORGANIC LIGHT EMITTING DIODE DISPLAY DEVICE INCLUDING THE SAME

(71) Applicant: LG DISPLAY CO., LTD., Seoul (KR)

(72) Inventor: Jang Jo, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 62 days.

(21) Appl. No.: 14/957,110

(22) Filed: Dec. 2, 2015

(65) Prior Publication Data

US 2016/0164016 A1    Jun. 9, 2016

(30) Foreign Application Priority Data

Dec. 8, 2014 (KR) .................. 10-2014-0175360

(51) Int. Cl.
*H01L 51/50* (2006.01)
*H01L 51/00* (2006.01)

(52) U.S. Cl.
CPC ...... *H01L 51/5064* (2013.01); *H01L 51/0007* (2013.01); *H01L 2251/5346* (2013.01)

(58) Field of Classification Search
CPC .................. H01L 51/5064; H01L 51/0007
See application file for complete search history.

(56) References Cited

U.S. PATENT DOCUMENTS

| 2009/0212691 | A1 | 8/2009 | Yang | |
| 2012/0267618 | A1* | 10/2012 | Monkman | H01L 51/0003 257/40 |
| 2013/0270600 | A1* | 10/2013 | Helander | H01L 51/5206 257/99 |
| 2016/0181533 | A1* | 6/2016 | Chen | H01B 1/122 252/521.5 |

FOREIGN PATENT DOCUMENTS

| JP | 2010-034143 A | 2/2010 |
| KR | 10-2008-0022017 A | 3/2008 |
| KR | 10-2009-0092051 A | 8/2009 |
| KR | 10-2012-0029142 A | 3/2012 |
| KR | 10-2012-0047572 A | 5/2012 |

* cited by examiner

*Primary Examiner* — Douglas Menz
(74) *Attorney, Agent, or Firm* — Dentons US LLP

(57) ABSTRACT

An organic light emitting element is disclosed. The organic light emitting element includes: a first electrode; a multi-sub-layered organic emission layer on the first electrode; a second electrode on the multi-sub-layered organic emission layer; and a blend barrier layer between two sub-layers of the multi-sub-layered organic emission layer, which are adjacent to each other and includes first solvents, and configured to include a second solvent having an opposite polarity to that of the first solvent. Such an organic light emitting element can have enhanced light emission efficiency and extended life span.

17 Claims, 2 Drawing Sheets

ORGANIC LIGHT EMITTING ELEMENT AND ORGANIC LIGHT EMITTING DIODE DISPLAY DEVICE INCLUDING THE SAME

The present application claims priority under 35 U.S.C. §119(a) of Korean Patent Application No. 10-2014-0175360 filed on Dec. 8, 2014 which is hereby incorporated by reference in its entirety for all purposes as if fully set forth herein.

BACKGROUND

Field of the Disclosure

The present application relates to an organic light emitting element and an organic light emitting diode (OLED) display device. More particularly, the present application is related to an organic light emitting element with enhanced light emission efficiency and extended lift span and to an OLED display device including the same.

Description of the Related Art

The organic light emitting element has features of superior light emission efficiency and self-luminescence. As such, the organic light emitting element has a very high potential capable of being used in several technical fields, such as image displays, illumination devices and so on, for a variety of purposes. However, all layers included in the organic light emitting element are ordinarily formed using a vapor deposition process.

Small-molecular and monomer organic light emitting elements of the related art have layers formed by the vapor deposition process. Such organic light emitting elements are being commonly used in 4-inch displays driven in an active matrix mode. In other words, the small molecular and monomer organic light emitting elements are used only in small-sized devices because the technology for properly fabricating a large-sized thin film transistor (TFT) substrate is not yet perfected. Small molecular and monomer materials can be obtained with high purity for high light emission efficiency through use of certain refinement techniques. However, such small molecular and monomer materials are one of the primary factors in limiting the size of a display device and increasing fabrication costs of the display device.

It is difficult for the vapor deposition process to be employed in mass-producing display devices with respect to time, costs and quantity. As an alternative, a so-called solution process has been receiving some attention.

However, an organic light emitting element fabricated using the solution process cannot provide higher efficiency compared to that fabricated using the vapor deposition process. Moreover, as currently known, the solution process must be partially used in the fabrication process of the organic light emitting element. In other words, the solution process cannot be used for all processes of fabricating the organic light emitting element. Also, it is difficult for the solution process to enhance light emission efficiency of the organic light emitting elements.

BRIEF SUMMARY OF THE INVENTION

Accordingly, embodiments of the present application are directed to an organic light emitting element and an OLED display device with the same that substantially obviate one or more problems due to the limitations and disadvantages of the related art.

The embodiments provide an organic light emitting element and an OLED display device with the same, which are adapted to enhance light emission efficiency and extend the life span by interposing a blend barrier layer between two organic emission layers which are adjacent to each other and each include one of a polar solvent and a non-polar solvent.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

In order to solve the above-mentioned problems, an organic light emitting element and an OLED display device according to a general aspect of the present embodiment include: a first electrode; a multi-sub-layered organic emission layer on the first electrode; a second electrode on the multi-sub-layered organic emission layer; and a blend barrier layer interposed between two sub-layers of the multi-sub-layered organic emission layer, which are adjacent to each other and include first solvents, and configured to include a second solvent having a contrary polarity to that of the first solvent.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
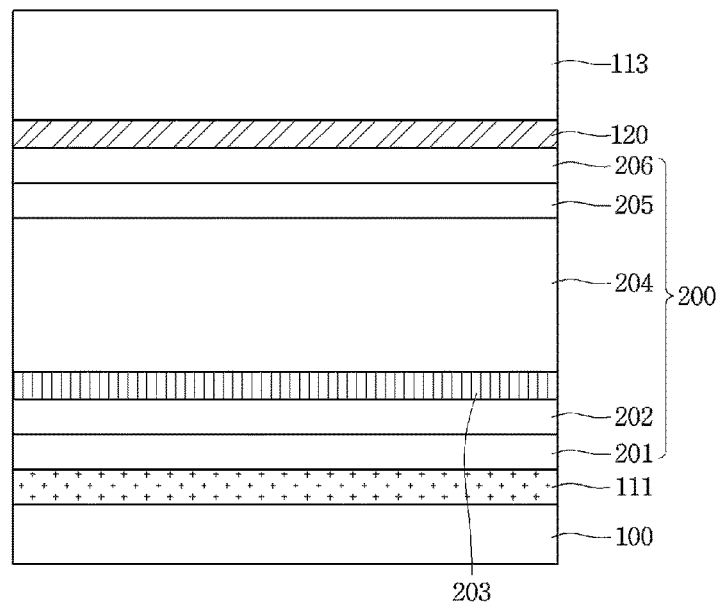
FIG. 1 is a cross-sectional view showing the structure of an organic light emitting element of an OLED display device according to an embodiment of the present disclosure.

Reference will now be made in detail to embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

FIG. 1 is a cross-sectional view showing the structure of an organic light emitting element of an OLED display device according to an embodiment of the present disclosure. Referring to FIG. 1, an organic light emitting element of the OLED display device includes a first electrode 111 disposed on a substrate 100. The first electrode 111 can be used as an anode electrode, but it is not limited to this. In other words, the first electrode 111 can be used as a cathode electrode.

The organic light emitting element further includes an organic emission layer 200 disposed on the first electrode 111, and a second electrode 120 disposed on the organic emission layer 200. The second electrode 120 can be a cathode electrode, but it is not limited to this. In other words, the second electrode 120 can be an anode electrode. Also, the organic light emitting element includes a sealing layer 113. The sealing layer 113 is used to protect the organic light emitting element.

The organic emission layer can be formed in a multi-sub-layered structure, in order to enhance the light emission efficiency. In detail, the organic emission layer 200 includes a hole injection layer 201, a hole transport layer 202, an emission layer 204, an electron transport layer 205 and an electron injection layer 206.

As such, the hole injection layer 201 is formed on the first electrode 111 through a solution process, and the hole transport layer 202 is formed on the hole injection layer 201 through the solution process. In this way, the emission layer 204, the electron transport layer 205 and the electron injection layer 206 are sequentially formed on the hole transport layer 202.

In other words, the organic emission layer 200 of the organic light emitting element can be formed by using an organic emission material solution. In detail, the organic emission layer 200 can be formed by using organic emission material solutions including first solvents which easily dissolve organic emission materials such as a hole injection layer material, a hole transport layer material, an emission layer material, an electron transport layer material or an electron injection layer material.

The organic emission layer 200 can be formed in a multi-sub-layered structure using the organic emission material solutions. In this case, the hole injection layer 201 is formed by coating an organic emission material solution (i.e., a hole injection layer material solution), which includes a hole injection layer material, on the first electrode 111 and then drying (and/or curing) the organic emission material solution. Also, the hole transport layer 202 is formed by coating another organic emission material solution (i.e., a hole transport layer material solution), which includes a hole transport layer material, on the hole injection layer 201 and then drying (and/or curing) the coated another organic emission material solution. Furthermore, the emission layer 204 is formed by coating still another organic emission material solution (i.e., an emission layer material solution), which includes an emission layer material, and then drying (and/or curing) the coated still another organic emission material solution. Moreover, the electron transport layer 205 and the electron injection layer 206 can be sequentially formed on the emission layer 204 using the same formation method as the hole injection layer 201, the hole transport layer 202 and the emission layer 204.

The first solvent contained in the organic emission material solution for the formation of the hole injection layer 201 can be a polar solvent or a non-polar solvent which can easily dissolve the hole injection layer material. Also, the first solvent contained in the organic emission material solution for the formation of the hole transport layer 202 can be a polar solvent or a non-polar solvent which can easily dissolve the hole transport layer material. Moreover, the first solvent contained in the organic emission material solution for the formation of the emission layer 204 can be a polar solvent or a non-polar solvent which can easily dissolve the emission layer material.

Solvents can be broadly classified into two categories: polar and non-polar. Polar solvents have strong polarity and non-polar solvents have weak or no polarity. If the first solvent of the hole injection layer 201 and the first solvent of the hole transport layer 202 that are directly adjacent to each other are in the same category (e.g., both are polar solvents or both are non-polar solvents), the first solvent remaining in the hole transport layer 202 may undesirably dissolve the hole injection layer material and the first solvent remaining in the hole injection layer 201 may undesirably dissolve the hole transport layer material at the interface of the two sub-layers. In other words, as the first solvents of the organic emission material solutions for forming the two adjacent layers have the same polarity, the two layer materials tend to be undesirably blended (or mixed) with each other at the interface between the two sub-layers, and the life span of the organic light emitting element may deteriorate.

Also, when the hole transport layer 202 and the emission layer 204 directly adjacent to each other are formed using the organic emission material solutions including the first solvents that are in the same category (e.g., either polar solvents or non-polar solvents) the first solvent remaining in the hole transport layer 202 may dissolve the emission layer material and the first solvent remaining in the emission layer 204 may dissolve the hole transport layer material at the interface of the two sub-layers. In other words, as the first solvents of the organic emission material solutions for forming the two adjacent layers have the same polarity, the two layer materials tend to be undesirably blended (or mixed) with each other at the interface between the two sub-layers, and the life span of the organic light emitting element may deteriorate.

To address this matter, sub-layers of the organic emission layer 200 can be disposed apart from one another (or somehow isolated or separated from each other) to minimize any blending (or any mixture). For example, if the organic emission layer 200 includes a first sub-layer, a second sub-layer disposed adjacently to the first sub-layer and a third sub-layer disposed adjacently to the second sub-layer, then the first through third sub-layers are to be disposed (or separated) without being blended (or mixed) with one another. To achieve such separation, a solvent used for the formation of the first sub-layer and a solvent used for the formation of the third sub-layer have a different polarity from that of a solvent for the formation of the second sub-layer. For example, if the solvents used for the formation of the first and third sub-layers are polar solvents, then the solvent used for the formation of the second sub-layer is a non-polar solvent.

In other words, an organic light emitting element can include: a first electrode, a second electrode and a multi-sub-layered organic emission layer interposed between the first electrode and the second electrode. The multi-sub-layered organic emission layer includes a first sub-layer, a second sub-layer directly on the first sub-layer and a third sub-layer directly on the second sub-layer. The first sub-layer and the third sub-layer each include a first solvent, and the second sub-layer includes a second solvent having an opposite polarity to that of the first solvent.

The first solvent present in the first sub-layer and the third sub-layer can be a non-polar solvent, and the second solvent present in the second sub-layer can be a polar solvent. Alternatively, the first solvent present in the first sub-layer and the third sub-layer can be a polar solvent, and the second solvent present in the second sub-layer can be a non-polar solvent. The first sub-layer may be a hole transport layer and the third sub-layer may be an emission layer.

As such, the blend or mixture between the sub-layers can be prevented or minimized by the blend barrier layer. In accordance therewith, interfaces between the sub-layers formed through solution processes can be clearly distinguished (or defined) by the blend barrier layer. For example, the second sub-layer can be a blend barrier layer. In this case, an interface of the first sub-layer and the blend barrier layer can be interposed between the first sub-layer and the blend barrier layer. Also, an interface of the third sub-layer and the blend barrier layer can be interposed between the third sub-layer and the blend barrier layer.

In order to minimize the mixing phenomenon in between two adjacent sub-layers of the organic emission layer 200, the organic emission layer 200 of the organic light emitting element according to the present disclosure further includes a blend barrier layer 203 (or some other functional layer serving such purpose) interposed between the two sub-layers which are disposed adjacently to each other within the organic emission layer 200 and formed using organic emission material solutions including solvents of the same polarity. In other words, two sub-layers, the blend barrier layer 203 is in between thereof, contains first solvents being in the same category (e.g., either polar solvents or non-polar solvents).

The blend barrier layer 203 can be formed using a blend barrier layer material solution. The blend barrier layer material solution includes a blend barrier layer material and a second solvent. The second solvent of the blend barrier layer material solution is a non-polar solvent when the first solvents are polar solvents. On the contrary, if the first solvents are non-polar solvents, the second solvent of the blend barrier layer material solution is a polar solvent. In other words, the second solvent of the blend barrier layer 203 and the first solvent of the sub-layer directly adjacent to the blend barrier layer 203 are of different categories (e.g., either polar or non-polar solvents) with respect to each other.

The blend barrier layer 203 interposed between the hole transport layer 202 and the emission layer 204 will now be described in detail as an embodiment of the present disclosure. In this embodiment, the hole transport layer 202 and the emission layer 204 are formed using the organic emission material solutions which include the first solvents with weak or no polarity. Meanwhile, the blend barrier layer 203 is formed using the blend barrier layer material solution which includes the second solvent with strong polarity.

The second solvent can have a boiling point range of about 50° C.~80° C. If the boiling point of the second solvent is below 50° C., it is difficult to constantly maintain the density of the blend barrier layer material within the blend barrier layer material solution due to high volatility of the second solvent. When the boiling point of the second solvent is above 80° C., the quantity of the second solvent remaining in the blend barrier layer 203 increases and the second solvent remaining in the blend barrier layer 203 acts as an impurity which interrupts the drift of electrons or holes.

If the second solvent included in the blend barrier layer material solution is a polar solvent, the second solvent may be one of methanol and isopropyl alcohol. As the blend barrier layer 203 formed by the blend barrier layer material solution including the polar solvent is interposed between the hole injection layer 202 and the emission layer 204 formed by the organic emission material solutions which include non-polar solvents, the hole injection layer 202 and the emission layer 204 can be completely or effectively separated from each other without being blended (or mixed) with each other. In accordance therewith, interfaces between the sub-layers formed through the solution processes can be clearly distinguished by the blend barrier layer.

In this case, the non-polar solvent remaining in the hole injection layer 202 cannot dissolve the blend barrier layer material of the blend barrier layer 203 which is dissolved in the polar solvent. Also, the polar solvent remaining in the blend barrier layer 203 cannot dissolve the hole injection layer material of the hole injection layer 202 which is dissolved in the non-polar solvent. As such, the hole injection layer 202 and the blend barrier layer 203 can be completely or effectively separated from each other without being blended (or mixed) with each other.

Similarly, the polar solvent remaining in the blend barrier layer 203 cannot dissolve the emission layer material of the emission layer 204 which is dissolved in the non-polar solvent. Also, the non-polar solvent remaining in the emission layer 204 cannot dissolve the blend barrier layer material of the blend barrier layer 203. As such, the blend barrier layer 203 and the emission layer 204 can be completely or effectively separated from each other without being blended (or mixed) with each other. In accordance therewith, the hole injection layer 202 and the emission layer 204 can also be completely or effectively separated from each other.

The blend barrier layer material may include a transparent material. As such, light emitted from the emission layer 204 can be output in a direction penetrating though the substrate 100.

In detail, the blend barrier layer material may be one of a transition metal oxide and a polyelectrolate. For example, the transition metal oxide can be one of a tungsten oxide WOx, a molybdenum oxide MoOx, a vanadium oxide VOx, a ruthenium oxide RuOx, a rhenium oxide ReOx, a titanium oxide TiOx and zinc oxide ZnO. Such transition metal oxides can be easily dissolved in the second solvent having strong polarity.

The polyelectrolate used as the blend barrier layer material may be a material which has counter-ions existing in its lateral branches. Actually, the polyelectrolate may be FFQ-Br (cationic poly(9,9'-bis(6"-N,N,N-trimethylammonium-hexyl)fluorine-co-alt-phenylene) with bromide counter-ions), but it is not limited to this. In other words, some other material that includes counter-ions, which exist in lateral branches and are used to electrically balance with one of positive and negative ion groups, that are opposite to one of negative and positive ions can be used as the polyelectrolate. As such, the polyelectrolate can have strong polarity. In accordance therewith, the polyelectrolate can be easily dissolved in the second solvent corresponding to a polar solvent.

In this manner, the organic emission layer 200 of the organic light emitting element according to the present disclosure includes the blend barrier layer 203 interposed between the hole transport layer 202 and the emission layer 204 which have a tendency to be blended (or mixed) with each other. As such, the blend (or mixture) between the hole transport layer 202 and the emission layer 204 can be prevented or minimized due to the blend barrier layer 203. In accordance therewith, the life span of the organic light emitting element can be extended.

Figure 2:
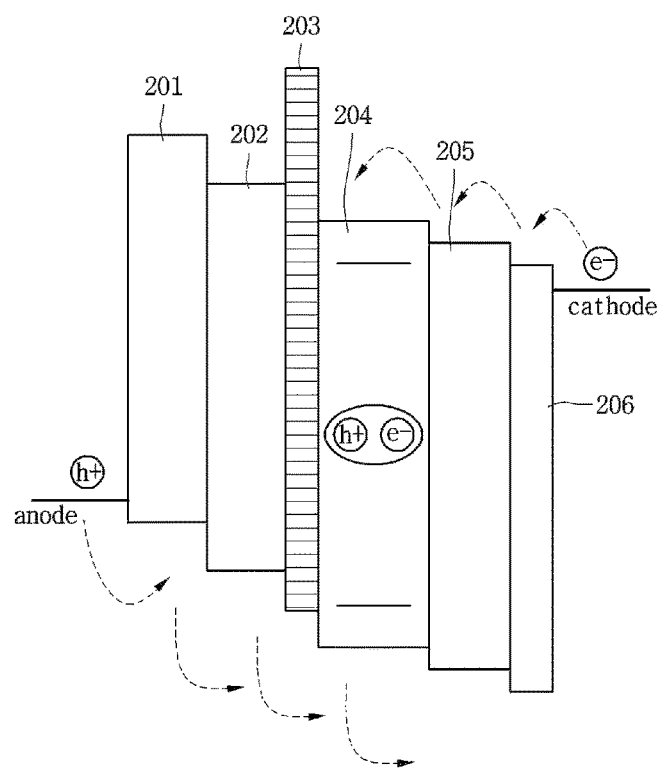
FIG. 2 is a cross-sectional view showing an organic light emitting element according to an embodiment of the present disclosure.

Subsequently, the organic light emitting element according to the present disclosure will be described in detail with reference to FIG. 2, which is a cross-sectional view schematically showing an organic light emitting element according to an embodiment of the present disclosure. Referring to FIG. 2, the organic light emitting element of the present disclosure includes an organic emission layer interposed between an anode electrode and a cathode electrode.

The organic emission layer includes a hole injection layer 201, a hole transport layer 202, an emission layer 204, an electron transport layer 205 and an electron injection layer 206. Also, the organic emission layer includes a blend barrier layer 203 interposed between the hole transport layer 202 and the emission layer 204. Although the blend barrier layer 203 is interposed between the hole transport layer 202 and the emission layer 204 in this embodiment, the position of the blend barrier layer 203 is not limited to this.

If a driving voltage is applied between the anode electrode and the cathode electrode, holes passing through the hole transport layer 202 and electrons passing through the electron transport layer 205 are drifted into the emission layer 204. As such, excitons are formed through recombination of the holes and the electrons. In accordance therewith, the emission layer 204 can emit visible light.

The blend barrier layer 203 can prevent or minimize the blend (or mixture) of the hole transport layer material and the emission layer material which is caused by the solvents remaining in the hole transport layer 202 and the emission layer 204. Such a blend barrier layer can be formed in a thickness range of about 1 nm~5 nm.

If the thickness of the blend barrier layer 203 is below 1 nm, the uniformity of the blend barrier layer 203 can deteriorate. When the thickness of the blend barrier layer 203 is above 5 nm, the recombination zone of electrons and holes may be undesirably shifted away from or out of the emission layer 204.

Also, the blend barrier layer 203 can have a work function range of about 5.1 eV~6.0 eV. If the work function of the blend barrier layer material is either below 5.1 eV or above 6.0 eV, the quantity of holes transferring from the hole transport layer 202 to the emission layer 204 may be reduced. As a result, the power consumption of the organic light emitting element increases and also the life span of the organic light emitting element is reduced.

The organic light emitting element of the present disclosure includes the blend barrier layer 203 interposed between the hole transport layer 202 and the emission layer 204. As such, the blend (or mixture) of the hole transport layer material and the emission layer material can be prevented or minimized. Also, the blend barrier layer 203 is formed to have a very small thickness and has a work function value between those of the hole transport layer 202 and the emission layer 204. In accordance therewith, the holes can be easily drifted.

Figure 3:
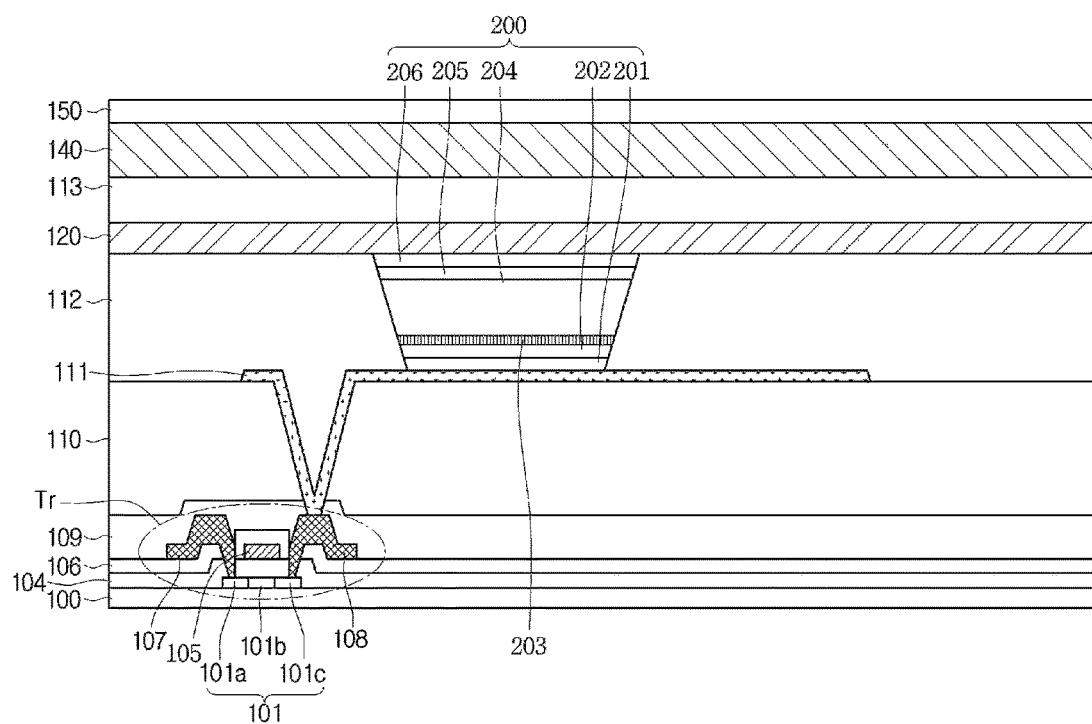
FIG. 3 is a cross-sectional view showing an OLED display device according to an embodiment of the present disclosure.

Next, an OLED display device according to an embodiment of the present disclosure will be described in detail with reference to FIG. 3, which is a cross-sectional view showing an OLED display device according to an embodiment of the present disclosure. Referring to FIG. 3, the OLED display device according to an embodiment of the present disclosure includes a thin film transistor Tr and an organic light emitting element sequentially disposed on a substrate 100. Also, the OLED display device includes a color filter array substrate 150 disposed to face the above-mentioned substrate 100.

The thin film transistor Tr includes a semiconductor layer 101, a gate insulation film 104, a gate electrode 105, a source electrode 107 and a drain electrode 108. Meanwhile, the organic light emitting element includes a first electrode 111, an organic emission layer 200 and a second electrode 120.

The semiconductor layer 101 is disposed on the substrate 100. Such a semiconductor layer 101 includes a source region 101a, a channel region 101b and a drain region 101c. Before the semiconductor layer 101 is formed, a buffer layer can be formed on the entire surface of the substrate 100.

The gate insulation film 104 is disposed on the entire surface of the substrate 100 provided with the semiconductor layer 101. The gate electrode 105 is disposed on the gate insulation film 104 opposite to the channel region 101b of the semiconductor layer 101. Such a gate electrode 105 can be formed from one of copper Cu, silver Ag, aluminum Al, chromium Cr, titanium Ti, tantalum Ta and alloys thereof. Although it is shown in the drawing that the gate electrode 105 is formed as a single layer, the gate electrode 105 can be formed in a layer-stacked structure including at least two metal layers as needed.

An interlayer insulation film 106 is disposed on the entire surface of the substrate 100 provided with the gate electrode 105. Also, contact holes exposing the source region 101a and the drain region 101c are formed in such a manner as to each penetrate through the interlayer insulation film 106 and the gate insulation film 104.

The source electrode 107 and the drain electrode 108 are disposed on the interlayer insulation film 106 provided with the contact holes. Also, the source electrode 107 and the drain electrode 108 are connected to the source region 101a and the drain region 101c via the contact holes. Such source and drain electrodes 107 and 108 can be formed from one of copper Cu, silver Ag, aluminum Al, chromium Cr, titanium Ti, tantalum Ta and alloys thereof. Although it is shown in the drawing that the source electrode 107 and the drain electrode 108 are formed as a single layer, the source electrode 107 and the drain electrode 108 can be formed in a layer-stacked structure including at least two metal layers as needed.

In this way, the thin film transistor Tr is disposed on the substrate 100. A plurality of thin film transistors separated from one another can be arranged on the substrate 100.

Thereafter, a passivation film 109 is disposed on the entire surface of the substrate 100 provided with the thin film transistor Tr. Also, a planarization film 110 is disposed on the entire surface of the substrate 100 provided with the passivation film 109. Moreover, a contact hole exposing the drain electrode 108 is formed in such a manner as to sequentially penetrate through the planarization film 110 and the passivation film 109.

The first electrode 111 of the organic light emitting element is formed on the planarization film 110 in such a manner as to be connected to the drain electrode 108 via the contact hole. Such a first electrode 111 can be used as an anode electrode, but it is not limited to this. In other words, the first electrode 111 can be used as a cathode electrode. In this embodiment, an organic light emitting element using the first electrode 111 as the anode electrode will be described.

Also, the first electrode 111 can be formed as a single layer and can be a transparent conductive material with a relatively high work function value. In this case, a bottom emission type OLED display device allowing light to be emitted from the second electrode 120 toward the first electrode 111 can be implemented.

Alternatively, the organic light emitting element further includes a reflection layer disposed under the first electrode 111. In this case, a top emission type OLED display device allowing light emitted from the second electrode 120 to be reflected by the first electrode 111 in an upward direction can be implemented.

Moreover, the first electrode 111 is not limited to the structure shown in the drawing. In other words, the first electrode 111 can be formed in a multi-layered structure. For example, the first electrode 111 can be formed in a triple-layered structure which includes a first layer, a second layer formed on the first layer and a third layer formed on the second layer.

The first and third layers included in the first electrode 111 with the triple-layered structure can be formed from a transparent conductive material. The transparent conductive material can become one of ITO (indium-tin-oxide) and IZO (indium-zinc-oxide). The second layer included in the first electrode 111 with the triple-layered structure can become a reflection layer. In detail, the second layer can become one of a metal layer and a metal alloy layer. For example, the second layer can become one of a silver layer and a metal alloy layer including silver Ag. In accordance therewith, the top emission type OLED display device allowing light emitted from the second electrode 120 to be reflected by the first electrode 111 in an upward direction can be implemented.

A bank pattern 112 can be formed on the planarization film 110 provided with the first electrode 111. The bank pattern 112 can define an emission region and a non-emission region. Also, an opening exposing a part of the first electrode on the emission region can be formed in the bank pattern 112.

The organic emission layer 200 can be formed on the first electrode 111 which is exposed in the emission region through the opening of the bank pattern 112. In order to enhance a light emission efficiency, the organic emission layer 200 can include a hole injection layer 201, a hole transport layer 202, an emission layer 204, an electron transport layer 205 and an electron injection layer 206. Also, the organic emission layer 200 can include a blend barrier layer 203 interposed between the hole transport layer 202 and the emission layer 204.

The blend barrier layer 203 can be formed using a blend barrier layer material solution. The blend barrier layer material solution can include a blend barrier layer material and a second solvent. The blend barrier layer material can become one of a transition metal oxide and a polyelectrolate. The second solvent can become a polar solvent. In other words, the blend barrier layer material solution can become a solution which is obtained by dissolving one of the transition metal oxide and the polyelectrolate in the second solvent.

The blend barrier layer material solution is coated on the hole transport layer 202. At this time, the second solvent of the blend barrier layer material solution coated on the hole transport layer 202 can be volatilized because of its boiling point range of about 50° C.~80° C. As such, the blend barrier layer material remains on the hole transport layer 202.

Also, when the blend barrier layer 203 is formed on the hole transport layer 202, the second solvent corresponding to a polar solvent cannot dissolve the hole transport layer material thereunder, which is dissolved in a non-polar solvent. As such, the hole transport layer material and the blend barrier layer material prevent or minimize to be blended (or mixed) with each other. In accordance therewith, an interface between the blend barrier layer 203 and the hole transport layer 202 can be definitely defined (or formed). In other words, the blend barrier layer 203 and the hole transport layer 202 can be clearly distinguished (or separated) from each other.

Similarly, when the emission layer 204 is formed on the blend barrier layer 203, the first solvent of the emission layer 204 corresponding to a non-polar solvent cannot dissolve the blend barrier layer material thereunder, which is dissolved in the polar solvent. As such, the emission layer material and the blend barrier layer material prevent or minimize to be blended (or mixed) with each other. In accordance therewith, an interface between the blend barrier layer 203 and the emission layer 204 can be definitely defined (or formed). In other words, the blend barrier layer 203 and the emission layer 204 can be clearly distinguished (or separated) from each other.

Such a blend barrier layer 203 can be formed thinner compared to the hole transport layer 202 and the emission layer 204. For example, the blend barrier layer 203 can be formed in a thickness range of about 1 nm~5 nm.

Moreover, the blend barrier layer 203 can be formed from one of the transition metal oxide and the polyelectrolate which have a work function range of about 5.1 eV~6.0 eV. As such, the holes can be smoothly drifted from the transport layer 202 to the emission layer 204.

The second electrode 120 facing the first electrode 111 can be disposed on the substrate 100 provided with the organic emission layer 200 and the bank pattern 112. Such a second electrode 120 can be used as a cathode electrode.

A sealing layer 113 can be disposed on the substrate 100 provided with the second electrode 120. Also, the color filter array substrate 150 is attached to the substrate 100, which is provided with the sealing layer 113, using an adhesive. The adhesive can be one of a photo curable resin and a thermosetting resin. Moreover, one of air, nitrogen and an adhesive can be filled in a space 140 between the substrate 100 and the color filter array substrate 150 which are combined with each other.

The OLED display device of the present disclosure allows the blend barrier layer 203 to be interposed between the hole transport layer 202 and the emission layer 204. As such, the blend (or mixture) of the hole transport layer material and the emission layer material in the interface between the hole transport layer 202 and the emission layer 204 can be prevented or minimized. Also, the blend barrier layer 203 is formed in a very small thickness and has a work function value between those of the hole transport layer 202 and the emission layer 204. In accordance therewith, the holes can be easily drifted.

As described above, the blend barrier layer 203 interposed between the hole transport layer 202 and the emission layer 204 has been explained as an embodiment, but the present disclosure is not limited to this. In other words, the disposition of the blend barrier layer 203 can be modified in a variety of configurations or characteristics in order to prevent or minimize the blend (or mixture) of different organic emission materials within the organic emission layer of a multi-layered structure.

Although the present disclosure has been limitedly explained regarding only the embodiments described above, it should be understood by the ordinary skilled person in the art that the present disclosure is not limited to these embodiments, but rather that various changes or modifications thereof are possible without departing from the technical aspects of the present disclosure. More particularly, various variations and modifications are possible in the component parts which are described in the embodiments. Accordingly, the scope of the present disclosure shall be determined only by the appended claims and their equivalents without being limited to the detailed description.

What is claimed is:

1. An organic light emitting element, comprising:
   a first electrode;
   a multi-sub-layered organic emission layer on the first electrode, the multi-sub-layered organic emission layer including a hole injection layer, a hole transport layer, an emission layer, an electron transport layer and an electron injection layer;
   a second electrode on the multi-sub-layered organic emission layer; and
   a blend barrier layer between the hole transport layer and the emission layer, which are adjacent to each other and include first solvents, and configured to include a second solvent having an opposite polarity to that of the first solvents,
   wherein the blend barrier layer has a specific thickness that provides optimal uniformity characteristics and electron/hole recombination characteristics, and has a specific work function that provides maximum lifespan and minimum power consumption.

2. The organic light emitting element of claim 1, wherein the blend barrier layer has a thickness range of about 1 nm-5 nm.

3. The organic light emitting element of claim 1, wherein each of the hole injection layer, the hole transport layer, the emission layer, the electron transport layer and the electron injection layer is an organic emission material and the first solvents which correspond thereto, and
   wherein the blend barrier layer is a blend barrier layer material and the second solvent.

4. The organic light emitting element of claim 3, wherein the first solvents are non-polar solvents.

5. The organic light emitting element of claim 3, wherein the second solvent is a polar solvent.

6. The organic light emitting element of claim 5, wherein the second solvent is one of methanol and isopropyl alcohol.

7. The organic light emitting element of claim 3, wherein the second solvent has a boiling point range of about 50° C.~80° C.

8. The organic light emitting element of claim 3, wherein the blend barrier layer material is one of a transition metal oxide and a polyelectrolate.

9. The organic light emitting element of claim 8, wherein the transition metal oxide is one of a tungsten oxide $WO_x$, a molybdenum oxide $MOO_x$, a vanadium oxide $VO_x$, a ruthenium oxide $RuO_x$, a rhenium oxide $ReO_x$, a titanium oxide $TiO_x$ and zinc oxide ZnO.

10. The organic light emitting element of claim 8, wherein the polyelectrolate includes counter-ions, which are used to electrically balance with one of positive and negative ion groups and exist in lateral branches, opposite to one of negative and positive ions.

11. The organic light emitting element of claim 3, wherein the blend barrier layer material is a transparent material.

12. The organic light emitting element of claim 1, wherein the blend barrier layer has a work function value range of 5.1 eV~6.0 eV.

13. An organic light emitting element comprising:
    a first electrode;
    a second electrode; and
    a multi-sub-layered organic emission layer, interposed between the first electrode and the second electrode, including a first sub-layer, a second sub-layer directly on the first sub-layer and a third sub-layer directly on the second sub-layer,
    wherein the first sub layer and the third sub layer each include a first solvent and the second sub-layer includes a second solvent having an opposite polarity to that of the first solvent and has a thickness range of about 1 nm~5 nm and a work function value range of 5.1 eV~6.0 eV.

14. The organic light emitting element of claim 13, wherein the multi-sub layered organic emission layer fabricated by a solution process.

15. The organic light emitting element of claim 13, wherein the second sub-layer includes at least one among a transition metal oxide and a polyelectrolate.

16. The organic light emitting element of claim 6, wherein the the polyelectrolate includes counter-ions, which are used to electrically balance with one of positive and negative ion groups and exist in lateral branches, opposite to one of negative and positive ions.

17. The organic light emitting element of claim 13, wherein the the polyelectrolate includes FFQ-Br.

* * * * *